United States Patent
Zolfaghari et al.

(10) Patent No.: US 8,073,044 B2
(45) Date of Patent: Dec. 6, 2011

(54) POLAR TRANSMITTER WITH DIGITAL AND ANALOG FILTERING OF ENVELOPE

(75) Inventors: Alireza Zolfaghari, Irvine, CA (US);
Hooman Darabi, Irvine, CA (US);
Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 1009 days.

(21) Appl. No.: 11/968,221

(22) Filed: Jan. 2, 2008

(65) Prior Publication Data
US 2009/0168863 A1 Jul. 2, 2009

(51) Int. Cl.
*H03H 7/30* (2006.01)
*H04L 7/12* (2006.01)
*H04L 25/03* (2006.01)
(52) U.S. Cl. .................. 375/229; 375/295; 375/296
(58) Field of Classification Search .............. 375/285, 375/295–297, 229; 455/91; 332/149, 159
See application file for complete search history.

(56) References Cited

U.S. PATENT DOCUMENTS

| | | | |
|---|---|---|---|
| 7,145,385 B2 * | 12/2006 | Brandt et al. | 330/10 |
| 2006/0062325 A1 * | 3/2006 | Jensen | 375/297 |
| 2006/0209986 A1 * | 9/2006 | Jensen et al. | 375/302 |
| 2006/0290203 A1 * | 12/2006 | Muller | 307/11 |
| 2007/0275676 A1 * | 11/2007 | Rofougaran et al. | 455/127.1 |
| 2009/0010372 A1 * | 1/2009 | Maeda | 375/376 |
| 2009/0161793 A1 * | 6/2009 | Nentwig | 375/297 |
| 2011/0021165 A1 * | 1/2011 | Lee | 455/127.5 |
| 2011/0059704 A1 * | 3/2011 | Norimatsu et al. | 455/110 |

OTHER PUBLICATIONS

Yan Li et al., "A De-Cresting Technique for Polar Transmitter Using Envelop-Tracking (ET) and SiGe Power Amplifier for Mobile WiMax," IEEE, 2009, pp. 1-4.*
Huang et al., "Filter Consideration in Polar Transmitters for Multi-mode Wireless Application," IEEE, 2005, pp. 1-4.*

* cited by examiner

*Primary Examiner* — Tesfaldet Bocure
(74) *Attorney, Agent, or Firm* — Garlick Harrison & Markison; Holly L. Rudnick

(57) ABSTRACT

A calibration circuit measures the variation in a filter resistor within the analog domain of the envelope path of a polar transmitter and produces a digital value representative of that variation. A digital processor determines a digital control signal from the digital value that is used to compensate, in the digital domain of the envelope path, for the variation in the filter resistor in the analog domain.

18 Claims, 6 Drawing Sheets

POLAR TRANSMITTER WITH DIGITAL AND ANALOG FILTERING OF ENVELOPE

BACKGROUND

1. Technical Field

The present invention relates to wireless communications and, more particularly, polar transmitters in wireless communication devices.

2. Related Art

Modern wireless radio frequency (RF) transmitters for applications, such as cellular, personal, and satellite communications, employ digital modulation schemes such as frequency shift keying (FSK) and phase shift keying (PSK), and variants thereof, often in combination with code division multiple access (CDMA) communication. Independent of the particular communications scheme employed, the RF transmitter output signal, $s_{RF}(t)$, can be represented mathematically as $$s_{RF}(t)=r(t)\cos(2\pi f_c t+\theta(t)) \quad (1)$$

where $f_c$ denotes the RF carrier frequency, and the signal components $r(t)$ and $\theta(t)$ are referred to as the envelope (amplitude) and phase of $s_{RF}(t)$, respectively.

Some of the above mentioned communication schemes have constant envelope, i.e., $$r(t)=R,$$

and these are thus referred to as constant-envelope communications schemes. In these communications schemes, $\theta(t)$ constitutes all of the information bearing part of the transmitted signal. Other communication schemes have envelopes (amplitudes) that vary with time and these are thus referred to as variable-envelope communications schemes. In these communication schemes, both $r(t)$ and $\theta(t)$ constitute information bearing parts of the transmitted signal.

A common transmitter used in variable-envelope communication schemes is the polar transmitter. In a typical polar transmitter architecture, digital baseband data enters a digital processor that performs the necessary pulse shaping and modulation to some intermediate frequency (IF) carrier $f_{IF}$ to generate digital amplitude-modulated and digital phase-modulated signals. The digital amplitude-modulated signal is input to a digital-to-analog converter (DAC), followed by a low pass filter (LPF), along an amplitude path, while the digital phase-modulated signal is input to another DAC, followed by another LPF, along a phase path. The output of the LPF on the amplitude path is an analog amplitude (envelope) signal, while the output of the LPF on the phase path is an analog phase signal. The analog phase signal is input to a phase-locked loop (PLL) to enable the phase of an RF output signal to track the phase of the analog phase signal. The RF output signal is modulated in a power amplifier (PA) by the analog amplitude signal. Thus, in polar transmitter architectures, the phase component of the RF signal is amplified through the PA while the amplitude modulation is performed at the output of the PA.

In practice, the power spectrum emitted from a polar transmitter will not be ideal due to various imperfections in the RF transmitter circuitry. For example, one component of the RF circuitry that significantly affects the performance of the transmitter is the design of the low pass filter along the envelope path. Although metal oxide semiconductor (MOS) capacitors are more stable over process variations than traditional metal capacitors in filter designs, the filter resistor may still exhibit performance variations due to process and temperature changes, thus producing an undesirable variable filter response that can significantly affect the quality of the envelope signal. Therefore, what is needed is a polar transmitter that is capable of compensating for variations in the envelope low pass filter.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
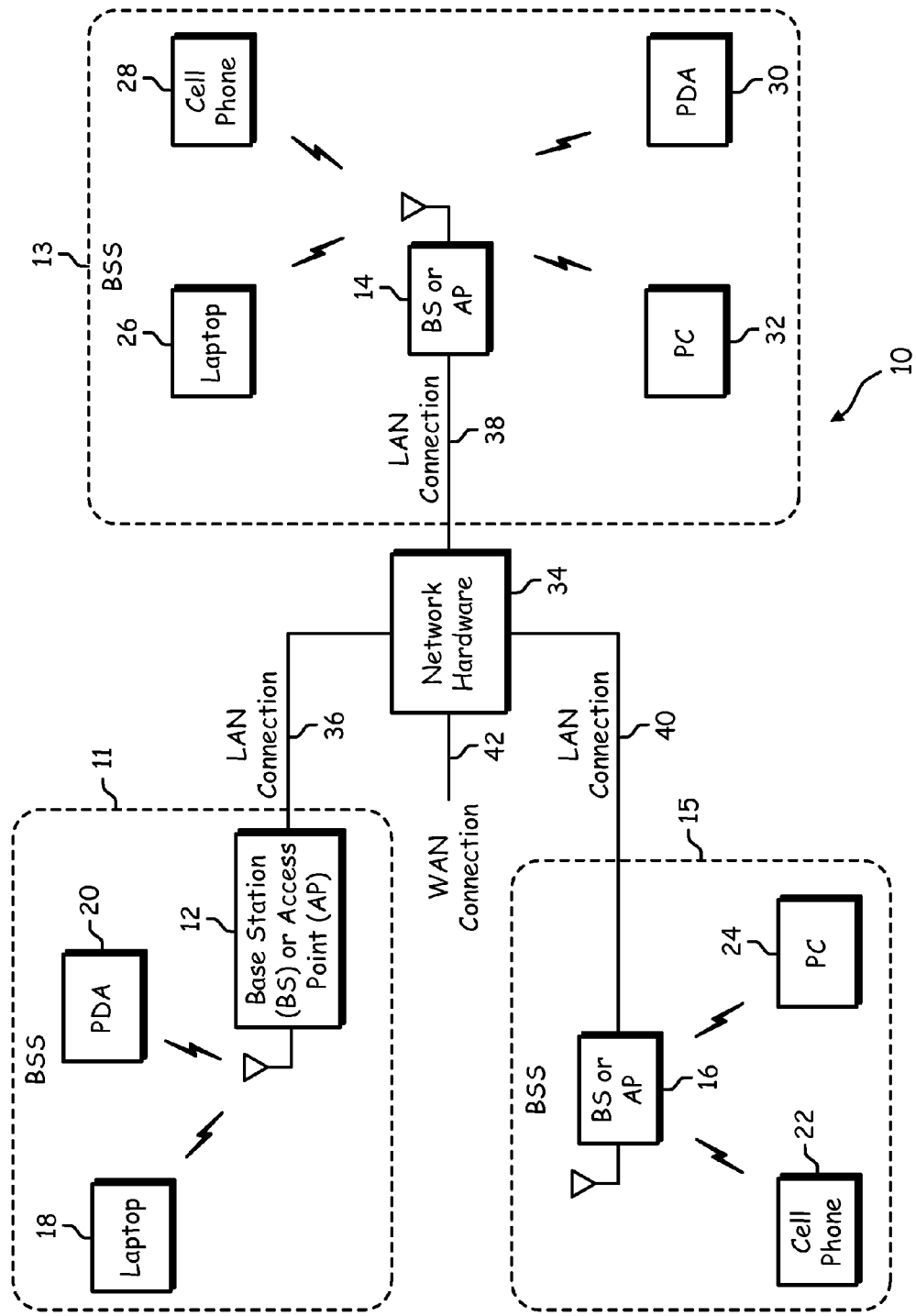
FIG. 1 is a functional block diagram illustrating a communication system that includes a plurality of base stations or access points (APs), a plurality of wireless communication devices and a network hardware component.

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail below with reference to FIGS. 2-5.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its respective area 11-15. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device and each of the base stations or access points includes a built-in radio and/or is coupled to a radio. The radio includes a transceiver (transmitter and receiver) for modulating/demodulating information (data or speech) bits into a format that comports with the type of communication system.

Figure 2:
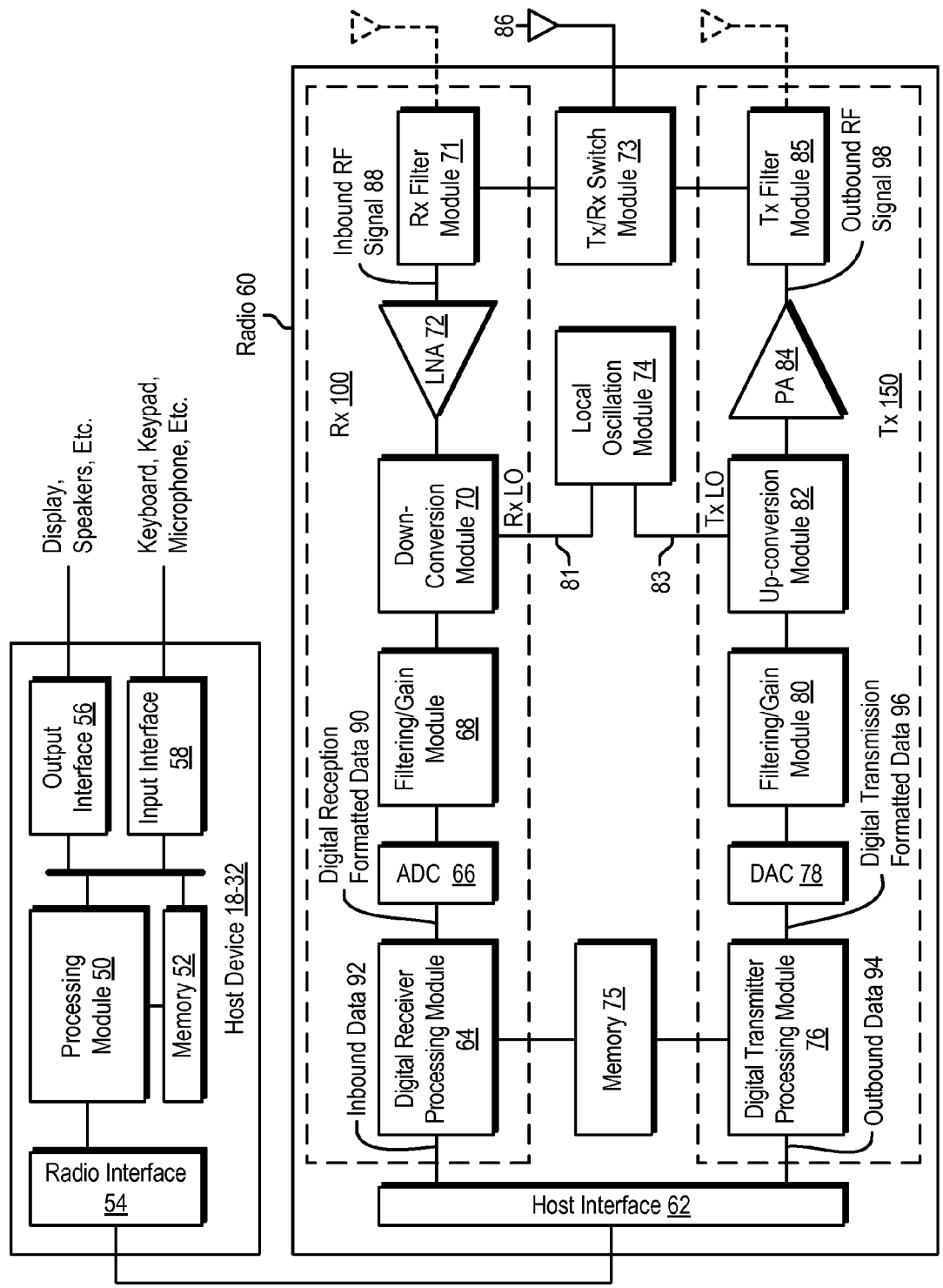
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device, such as a display, monitor, speakers, etc., such that the received data may be displayed. The radio interface 54 also provides data from the processing module 50 to the radio 60. The processing module 50 may receive the outbound data from an input device, such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a memory 75, a local oscillation module 74, a receiver 100, a transmitter 150, a transmitter/receiver (TX/RX) switch module 73 and an antenna 86. The receiver 100 includes a digital receiver processing module 64, an analog-to-digital converter 66, a filtering/gain module 68, a down-conversion module 70, a low noise amplifier 72 and a receiver filter module 71, while the transmitter 150 includes a digital transmitter processing module 76, a digital-to-analog converter 78, a filtering/gain module 80, an IF mixing up-conversion module 82, a power amplifier 84 and a transmitter filter module 85. The antenna 86 is shared by the transmitter 150 and receiver 100, as regulated by the TX/RX switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation.

The digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., GSM, EDGE, WCDMA, Bluetooth EDR, etc.) to produce digital transmission formatted data 96. The digital transmission formatted data 96 is a digital baseband signal or a digital low IF signal, where the low IF typically will be in the frequency range of 100 KHz to a few Megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the TX/RX switch module 73, where the RX filter module 71 bandpass filters the inbound RF signal 88. The RX filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. The down-conversion module 70 provides the inbound low IF signal or baseband signal to the filtering/gain module 68. The filtering/gain module 68 filters and/or attenuates the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of host device 18-32 and the digital receiver processing module 64 and the digital transmitter processing module 76 of radio 60 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

Figure 3:
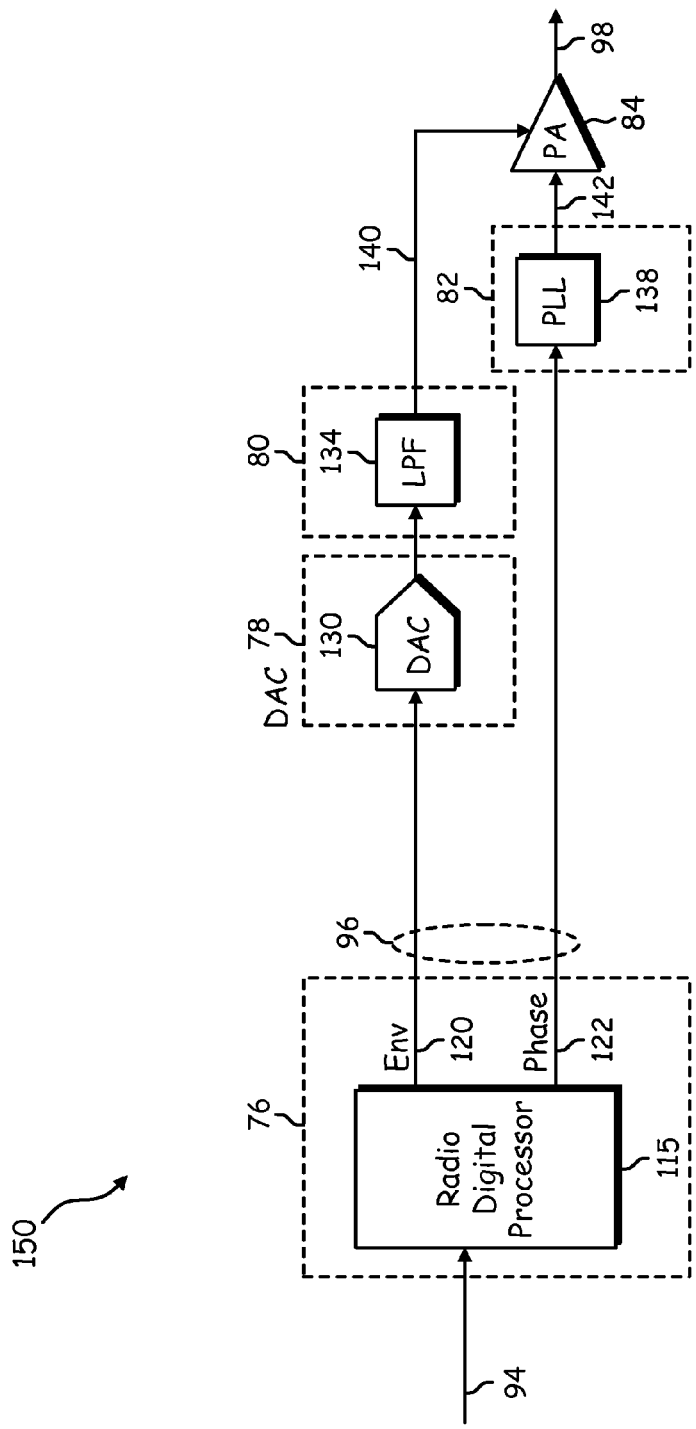
FIG. 3 is a schematic block diagram of an exemplary polar RF transmitter, in accordance with embodiments of the present invention.

FIG. 3 is a schematic block diagram of an exemplary architecture of a polar RF transmitter 150 for use within the radio transceiver 60 of FIG. 2, in accordance with embodiments of the present invention. The polar RF transmitter 150 shown FIG. 3 is functionally equivalent to blocks 76, 78, 80, 82 and 84 of FIG. 2. In FIG. 3, it is assumed that a baseband processor (not specifically shown) delivers baseband data 94 to the RF polar transmitter for further processing and RF transmission. To accomplish the additional processing and RF transmission, the polar transmitter of FIG. 3 further includes a radio digital processor 115, high sample rate digital-to-analog converter (DAC) 130, low pass filter (LPF) 134, a translational loop (e.g., a PLL) 138 and a power amplifier (PA) 84.

In an exemplary operation of the polar transmitter 150, the radio digital processor 115 performs the necessary pulse shaping, modulation, and interpolation filtering to produce a complex modulated digital signal 96 with an envelope (amplitude) component 120 and a phase component 122. The digital amplitude-modulated signal 120 output from the radio digital processor 115 is input to high sample rate DAC 130, followed by LPF 134 to produce an analog envelope (amplitude-modulated) signal 140. The phase-modulated signal 122 output from the radio digital processor 115 is input to the PLL 138. The PLL 138 translates, or up-converts, the phase-modulated signal to the desired RF output 142. With proper PLL 138 design, the phase of the RF output signal 142 tracks the phase of the input phase-modulated signal, as desired. The RF output signal 142 is modulated in the PA 84 by the analog amplitude-modulated signal 142 output from LPF 134 to produce the outbound RF signal 98. Thus, the phase component of the RF signal is amplified through the PA 84, while the amplitude modulation is performed at the output of the PA 84.

Figure 4:
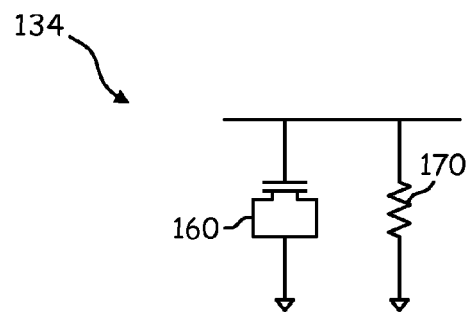
FIG. 4 is a circuit diagram of an exemplary low pass filter for use in a polar RF transmitter, in accordance with embodiments of the present invention.

Referring now to FIG. 4, there is illustrated an exemplary low pass filter 134 along the envelope path of the polar transmitter. As shown in FIG. 4, the low pass filter 134 includes a metal oxide semiconductor (MOS) capacitor 160 and a resistor 170. Although metal oxide semiconductor (MOS) capacitors are more stable over process variations than traditional metal capacitors in filter designs, the filter resistor may still exhibit performance variations due to process and temperature changes, thus producing an undesirable variable filter response that can significantly affect the quality of the envelope signal.

Figure 5:
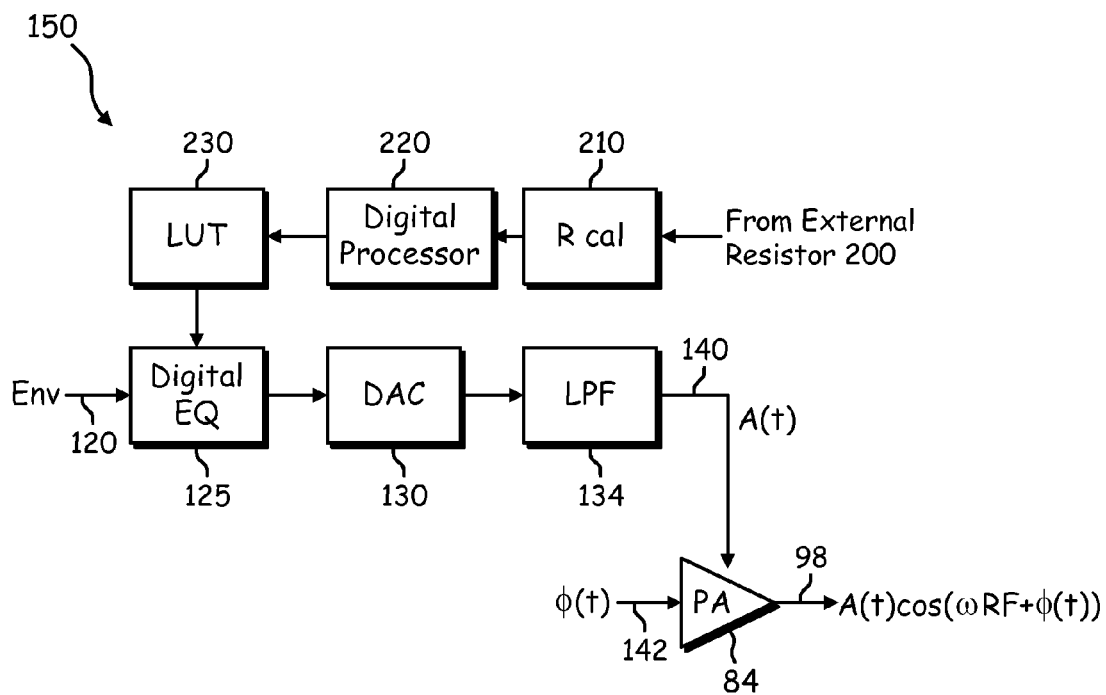
FIG. 5 is a schematic block diagram of an exemplary architecture for the envelope path of a polar transmitter that compensates for variations in the low pass filter resistor along the envelope path, in accordance with embodiments of the present invention.

Therefore, as shown in FIG. 5, and in accordance with embodiments of the present invention, digital filtering of the envelope signal is performed to compensate for variations in the resistor 170 of the analog LPF 134 of the polar transmitter. FIG. 5 is a schematic block diagram of an exemplary architecture for the envelope path of a polar transmitter that compensates for variations in the low pass filter resistor along the envelope path, in accordance with embodiments of the present invention. In FIG. 5, the envelope path of the polar transmitter 150 includes a resistor calibration circuit 210, a digital processor 220, a look-up-table 230, a digital equalizer 125, the digital-to-analog converter (DAC) 130 and the low pass filter (LPF) 134.

The digital equalizer 125 operates to digitally filter the digital amplitude-modulated signal 120 output from the radio digital processor shown in FIG. 3. In particular, the digital equalizer 125 of FIG. 5 operates to digitally compensate for the variations in the analog LPF resistor to achieve the desired frequency response of the envelope signal A(t) 140 input to the power amplifier 84 based on a digital control signal generated from the current LPF resistor variations. The digital control signal input to the digital equalizer 125 is selected from a plurality of digital control signals maintained by the look-up-table 230. Each of the digital control signals within the look-up-table is associated with a particular LPF resistor variation and is uniquely designed to adjust the frequency response of the digital equalizer 125 to compensate for that particular LPF resistor variation.

In an exemplary operation, the calibration circuit 210 measures the variation in the LPF filter response and produces a digital value (e.g., a digital code) representative of that variation. For example, in an exemplary embodiment, the calibration circuit 210 includes an internal calibration resistor that tracks the performance of the LPF resistor and is coupled to receive input from an external accurate resistor 200 (e.g., an on-board resistor). The external resistor 200 input provides an accurate resistor value against which the calibration circuit 210 compares the resistor value of the internal calibration resistor to measure the variation in the LPF resistor. More particularly, the external resistor value is indicative of a current operating condition of the external resistor 200, while the calibration resistor value is indicative of the current operating condition of the internal calibration resistor. The calibration circuit 210 calculates the difference between the accurate external resistor value and the internal calibration resistor value and uses this difference as the measurement of the variation in the LPF resistor.

The calibration circuit 210 then generates the digital value or code from this measurement that identifies the particular digital control signal within the look-up-table 230 that will substantially digitally compensate for the measured LPF resistor variation. Thus, the digital value produced by the calibration circuit 210 is input to the digital processor 220, which uses the digital value to address the look-up-table 230 and determine the appropriate digital control signal to be input to the digital equalizer 125 to digitally compensate for the variation in the LPF resistor and produce a corrected output envelope signal A(t) 140. The corrected output envelope signal A(t) 140 is input to the power amplifier 84, which uses the corrected output envelope signal A(t) 140 to modulate the phase signal φ(t) 142 and produce the desired modulated RF output signal A(t)cos (ωRF+φ(t)) 98.

Figure 6:
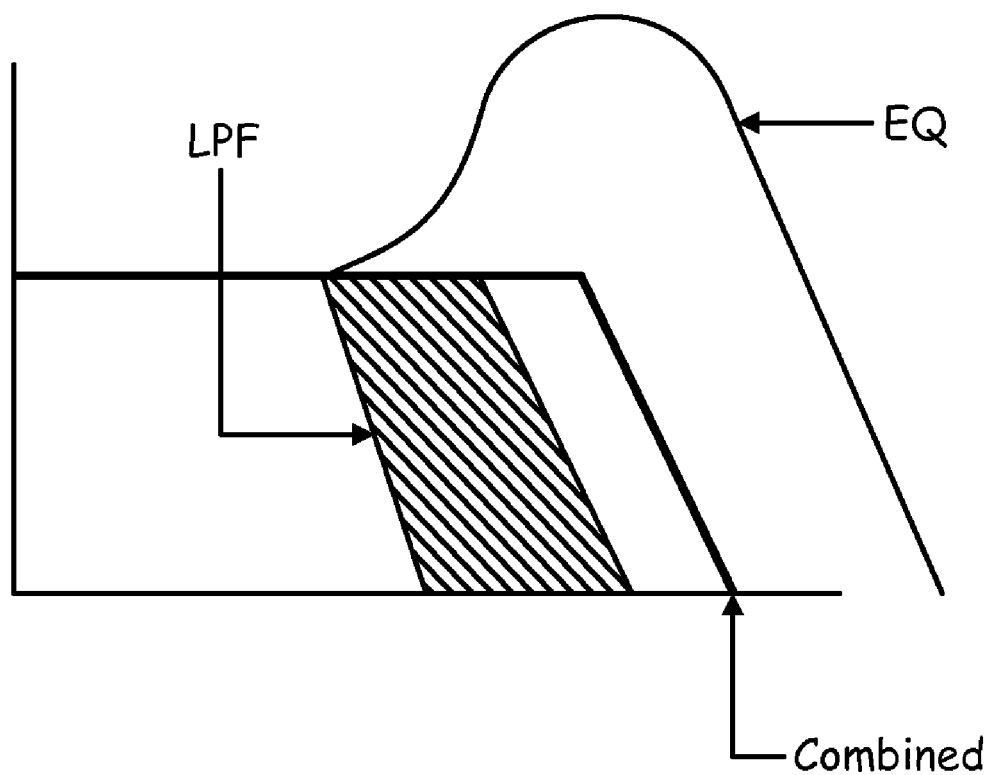
FIG. 6 is a graph illustrating an exemplary response of the digital equalizer that is able to compensate for a variable low pass filter response of the polar transmitter.

For example, as shown in FIG. 6, an exemplary variation in the low pass filter response due to the variation in the filter resistor is indicated by a lined area and the desired envelope output signal is indicated by the dark line labeled "combined." In order to compensate for the variation in the low pass filter response, as indicated by the lined area, the frequency response of the digital equalizer should be adjusted, as shown by the line labeled "EQ," to produce the desired envelope output signal, as indicated by the dark line labeled "combined."

Figure 7:
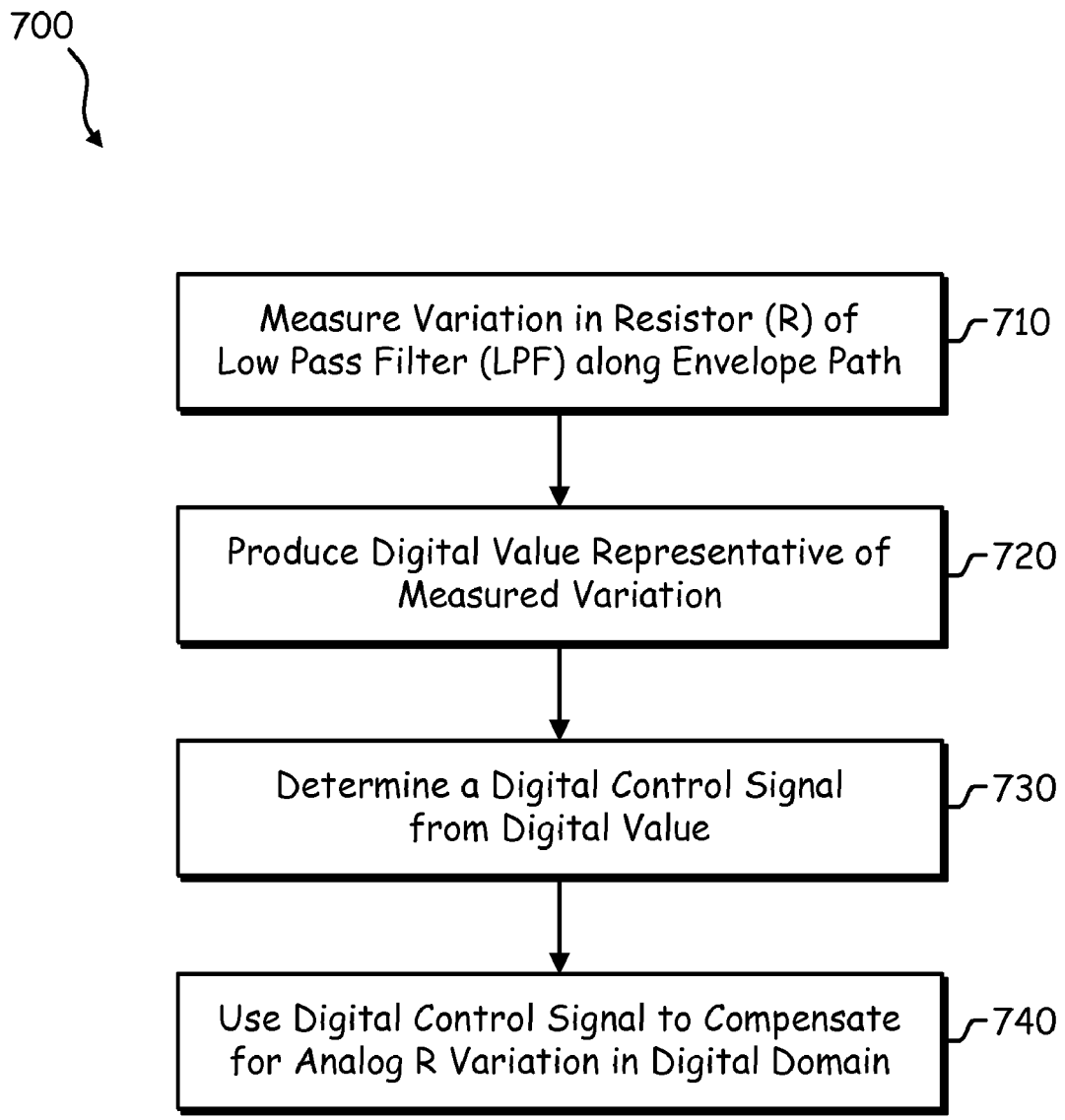
FIG. 7 is a flow chart illustrating a method in accordance with embodiments of the present invention.

FIG. 7 is a flow chart illustrating an exemplary method for digital and analog filtering of the envelope of a polar transmitter, in accordance with embodiments of the present invention. Initially, at step 710, the variation in the resistor within the analog low pass filter (LPF) along the envelope path of the polar transmitter is measured, and the resulting measurement is used, at step 720, to produce a digital value representative of the measured variation. At step 730, the digital value is used to determine a digital control signal that can compensate for the measured variation in the filter resistor within the digital domain at step 740. For example, in an exemplary embodiment, the digital value produced as a result of the measured analog resistor variation identifies a particular digital control signal that will substantially digitally compensate for the measured LPF resistor variation and ultimately produce a corrected envelope signal after filtering thereof by the LPF.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A radio frequency (RF) polar transmitter, comprising:
a digital equalizer coupled to receive a digital control signal and a digital amplitude-modulated signal of a variable-envelope modulated signal and operable to use the digital control signal to produce a corrected digital amplitude-modulated signal;
a Digital-to-Analog Converter (DAC) operably coupled to receive the corrected digital amplitude-modulated signal and operable to convert the corrected digital amplitude-modulated signal to an analog amplitude modulated-signal;
a low pass filter including a filter resistor and coupled to receive the analog amplitude-modulated signal and operable to filter the analog amplitude-modulated signal to produce a filtered analog modulated signal;
a calibration circuit operable to measure a variation in the filter resistor of the low pass filter and to produce a digital value representative of the variation in the filter resistor of the low pass filter; and
a digital processor coupled to receive the digital value and operable to determine the digital control signal from the digital value, the digital control signal operating to adjust a response of the digital equalizer to compensate for the variation in the filter resistor of the low pass filter.

2. The polar transmitter of claim 1, further comprising:
a look-up-table maintaining digital control signals and associated digital values and coupled to the digital processor to provide the digital control signal associated with the digital value representative of the variation in the resistor of the low pass filter to the digital equalizer.

3. The polar transmitter of claim 2, wherein the digital value representative of the variation in the resistor of the low pass filter is used to address the look-up-table.

4. The polar transmitter of claim 1, wherein:
the calibration circuit includes a calibration resistor that tracks the performance of the filter resistor and produces a calibration resistor value indicative of a current operating condition of the calibration resistor;
the calibration circuit is coupled to receive as input an external resistor value from an accurate external resistor that is indicative of a current operating condition of the accurate external resistor; and
the calibration circuit is further operable to compare the calibration resistor value to the external resistor value to measure the variation in the filter resistor.

5. The polar transmitter of claim 1, wherein the digital equalizer is coupled to receive the digital control signal in real-time.

6. The polar transmitter of claim 1, wherein the digital equalizer is coupled to receive the digital control signal periodically.

7. The polar transmitter of claim 1, further comprising:
a power amplifier operable to produce a modulated RF signal from the filtered analog amplitude-modulated signal and a phase component of the variable-envelope modulated signal.

8. The polar transmitter of claim 7, further comprising:
a translational loop coupled to receive a phase-modulated digital signal and operable to up-convert the phase-modulated digital signal from an intermediate frequency to a radio frequency to produce an RF signal corresponding to the phase component of the variable-envelope modulated signal.

9. The polar transmitter of claim 1, wherein the low pass filter further includes a metal oxide semiconductor (MOS) capacitor.

10. A method for digital and analog filtering of the envelope of a polar transmitter, said method comprising:

measuring a variation in an analog filter resistor in an analog domain of an envelope path of the polar transmitter;
producing a digital value representative of the variation in the analog filter resistor;
determining a digital control signal from the digital value; and
adjusting a response of a digital equalizer using the digital control signal to compensate for the variation in the analog filter resistor in a digital domain of the envelope path of the polar transmitter.

11. The method of claim 10, further comprising:
receiving a digital amplitude-modulated signal of a variable-envelope modulated signal.

12. The method of claim 11, further comprising:
filtering the digital amplitude-modulated signal using the digital equalizer to produce a corrected digital amplitude-modulated signal.

13. The method of claim 12, further comprising:
converting the corrected digital amplitude-modulated signal to an analog amplitude modulated-signal;
filtering the analog amplitude-modulated signal using the filter resistor to produce a filtered analog modulated signal; and
producing a modulated RF signal from the filtered analog amplitude-modulated signal and a phase component of the variable-envelope modulated signal produced along a phase path of the polar transmitter.

14. The method of claim 13, further comprising:
receiving a phase-modulated digital signal of the variable-envelope modulated signal along the phase path of the polar transmitter; and
up-converting the phase-modulated digital signal from an intermediate frequency to a radio frequency to produce an RF signal corresponding to the phase component of the variable-envelope modulated signal.

15. The method of claim 10, wherein said determining the digital control signal further includes:
maintaining a look-up-table of digital control signals and associated digital values; and
using the digital value representative of the variation in the filter resistor to address the look-up-table and retrieve the digital control signal associated therewith.

16. The method of claim 10, wherein said measuring the variation in the filter resistor further includes:
providing a calibration resistor that tracks the performance of the filter resistor;
producing a calibration resistor value indicative of a current operating condition of the calibration resistor;
receiving an external resistor value from an accurate external resistor that is indicative of a current operating condition of the accurate external resistor; and
comparing the calibration resistor value to the external resistor value to measure the variation in the filter resistor.

17. The method of claim 10, wherein said adjusting the response of the digital equalizer is performed in real-time.

18. The method of claim 10, wherein said adjusting the response of the digital equalizer is performed periodically.

* * * * *